United States Patent [19]

Bertagnolli et al.

[11] Patent Number: 5,460,982
[45] Date of Patent: Oct. 24, 1995

[54] METHOD FOR MANUFACTURING LATERAL BIPOLAR TRANSISTORS

[75] Inventors: Emmerich Bertagnolli; Helmut Klose, both of Munich, Germany

[73] Assignee: Siemens Aktiengesellschaft, Munich, Germany

[21] Appl. No.: 261,263

[22] Filed: Jun. 14, 1994

[30] Foreign Application Priority Data

Jul. 2, 1993 [DE] Germany ............. 43 22 138.6

[51] Int. Cl.⁶ ............... H01L 21/265; H01L 21/302; H01L 21/76; H01L 21/20
[52] U.S. Cl. .............. 437/21; 437/32; 437/62; 437/84
[58] Field of Search ............. 437/31, 32, 62, 437/21, 84; 148/DIG. 150, DIG. 96, DIG. 10, DIG. 9; 257/557, 506

[56] References Cited

U.S. PATENT DOCUMENTS

| | | | |
|---|---|---|---|
| 3,476,617 | 11/1969 | Robinson | 257/557 |
| 3,815,223 | 6/1974 | Allison | 437/62 |
| 4,545,113 | 10/1985 | Vora | 437/32 |
| 4,792,837 | 12/1988 | Zazzu | 257/557 |
| 5,027,184 | 6/1991 | Soclof | 257/506 |
| 5,031,014 | 7/1991 | Soclof . | |
| 5,073,506 | 12/1991 | Maszara et al. | 437/21 |
| 5,075,737 | 12/1991 | Shinohara | 257/557 |
| 5,087,580 | 2/1992 | Eklund | 437/32 |
| 5,100,810 | 3/1992 | Yoshimi et al. | 437/32 |

OTHER PUBLICATIONS

T. Sugii et al., "A New SOI-Lateral Bipolar Transistor for High-Speed Operation", Jap. J. Appl. Phy. 30, L2080–L2082(1991).
J. Sturm et al., "A Lateral Silicon-on-Insulator Bipolar Transistor with a Self-Aligned Base Contact", IEEE Electron Device Letters, vol. EDL-8, No. 3, Mar. 1987, pp. 104–106.
T. Sugii et al., "Epitaxially Grown Base Transistor for High-Speed Operation", IEEE Electron Device Letters, vol. EDL-8, No. 11, Nov. 1987, pp. 528–530.
T. H. Ning et al., "High Performance Lateral Bipolar Transistor on Insulating Substrate", IBM Technical Disclosure Bulletin, vol. 26, No. 11, Apr. 1984, pp. 5868–5862.

Primary Examiner—Olik Chaudhuri
Assistant Examiner—Brian K. Dutton
Attorney, Agent, or Firm—Hill, Steadman & Simpson

[57] ABSTRACT

Manufacturing method for lateral bipolar transistors, wherein a highly doped emitter zone and collector zone as well as a base terminal zone are manufactured in a region in the silicon layer of a SOI substrate having a basic doping. The zones are manufactured by implantation using a mask. A base zone is then produced by implantation of dopant using the mask. The base zone is produced between the emitter zone and the collector zone.

7 Claims, 3 Drawing Sheets

METHOD FOR MANUFACTURING LATERAL BIPOLAR TRANSISTORS

BACKGROUND OF THE INVENTION

1. Field of the Invention

The present invention is directed generally to transistors and more specifically to a method for manufacturing lateral bipolar transistors.

2. Description of the Related Art

A layer sequence for emitter, base and collector vertically arranged above one another is standard in integrated bipolar transistors. In this vertical arrangement, two zones of the layer sequence are not directly accessible from the surface, but must be laterally lengthened and subsequently conducted to the surface. A further, highly doped buried layer is generally also necessary for the lowest, doped layer in order to keep the lead to the surface of an adequately low impedance. The actual transistor, i.e. the npn or pnp sequence of the layers is not photolithographically defined, but is defined by diffusion processes and implantations, so that dimensions in the sub-µm range can be achieved without problems. The disadvantage of this arrangement is that vertical transistors have a noteworthy depth expanse, typically 1–2 µm, and lateral dimensions that exceed the actual transistor region by a multiple. Correspondingly, there are a number of parasitic capacitances and resistances that, in addition to causing possible losses in the switching speed, noticeably increase the power consumption. In addition, the complexity of the manufacturing process and the area requirements of these components are extremely high compared to MOS components causing low yields and high manufacturing costs. The simultaneous manufacture of complementary structures (npn and pnp transistors), for example for analog applications, is possible only with substantial outlay.

Given laterally arranged bipolar transistors, the regions for emitter and collector are usually embedded in a larger base region, so that these transistors also have a relatively large expanse in depth. A simple manufacturing method for such lateral transistors is still unknown.

SUMMARY OF THE INVENTION

It is an object of the present invention to provide a method for the manufacture of lateral bipolar transistors for use in the region of optimal low power and reduced supply voltages, wherein the integration of npn and pnp transistors in one component is enabled.

The objects of the present invention are achieved in a method for manufacturing a lateral bipolar transistor, having the steps of laterally electrically insulating a region provided for a transistor in a silicon layer that is located on an insulating layer, the region having a basic doping, producing a highly doped emitter zone, a highly doped base terminal zone and a highly doped collector zone by implantation of dopants using masks, producing a base zone by an implantation of dopant in the silicon layer for a conductivity type opposite that of the basic doping using a mask and applying metal electrical contacts to the emitter zone, the base zone and the collector zone for contacting an emitter, base and collector, respectively.

In the method of the invention, lateral bipolar transistors are produced in a thin silicon layer of, for example, an SOI substrate. The differently doped regions for emitter, base and collector are thereby produced by implantation of dopant into a basic doping by using masks.

A detailed description of the manufacturing method of the present invention follows with reference to the figures.

DETAILED DESCRIPTION OF THE PREFERRED EMBODIMENTS

The method of the invention advantageously uses an SOI substrate (silicon on insulator). Instead of an actual SOI substrate, SIMOX material or a corresponding layer structure produced by wafer bonding can also be used. A thin useful layer of silicon is applied on an insulating background or on an insulating intermediate layer and can be processed with the standard methods of silicon technology. The method of the invention is equally well-suited for the manufacture of npn transistors and pnp transistors. In order to keep the description of the exemplary embodiments as specific as possible, the manufacture of an npn transistor shall be set forth below. For manufacturing pnp transistors, only the operational signs of the dopings are to be correspondingly interchanged.

The region provided for the transistor in the silicon layer which, for example, can be 2 µm–20 nm thick is laterally insulated all around and has a basic doping. It is simplest when the silicon layer is already provided at the beginning of the method with a basic doping having a density of approximately $10^{15}$–$10^{17}$ cm$^{-3}$ (phosphorus or arsenic as the dopant for n-dopings). The insulation of the edges can ensue, for example, with LOCOS or by trench etching or the like. A combination of these measures can also be considered. It is assumed in the exemplary embodiment that lateral insulation regions are produced with LOCOS.

Figure 1:
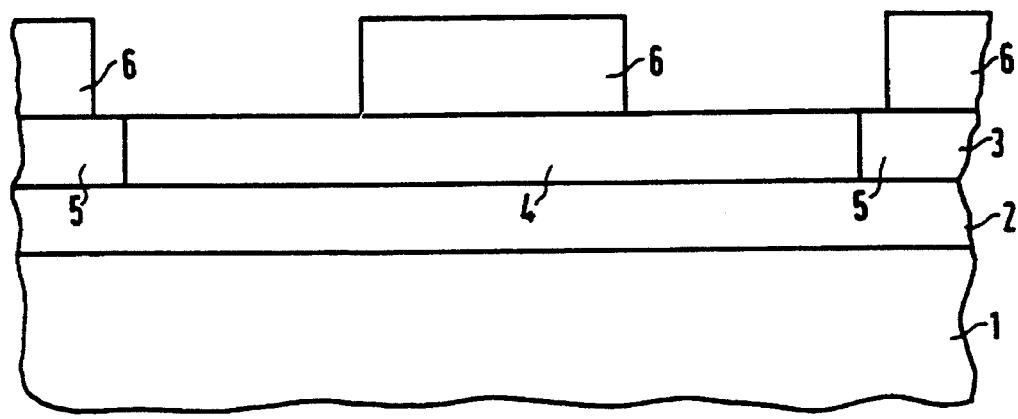
FIGS. 1–3 illustrate an inventively manufactured transistor in cross section after various steps of the manufacturing method of the present invention.
Figure 2:
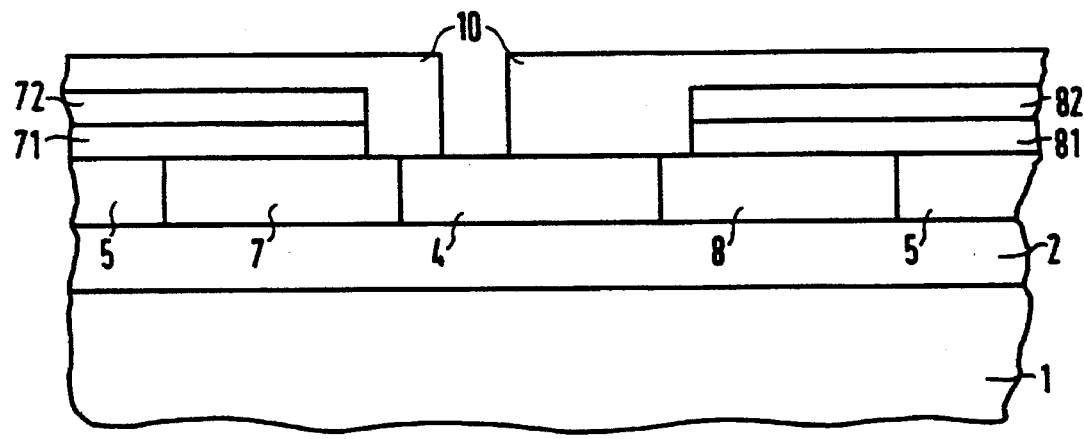

A substrate 1, an insulation layer 2 and a silicon layer 3 are shown in FIG. 1. A region 4 provided with the basic doping and lateral insulation regions 5 are shown in cross section in the silicon layer 3. The insulation layer 2 can, for example, be $SiO_2$. Implantations of dopants for the terminal regions of an emitter, collector and base are performed with photolithography and use masks 6 produced therewith. The height of the doping is selected for a low-impedance metal-to-semiconductor contact for the later electrical contacting. A highly doped emitter zone 7, which is simultaneously provided as emitter terminal zone, and a highly doped collector zone 8, which is provided as collector terminal zone, thus result as shown in FIG. 2. The highly doped base terminal zone having the opposite operational sign of the conductivity is located outside the cross section shown in FIG. 2. Just like the sequence of the manufacture of the basic doping and of the insulation regions, the sequence of the production of the n$^+$-doped and of the p$^+$-doped zones is arbitrary. The p$^+$-doped zones are produced, for example, by ion implantation of boron as a dopant. Potentially, the dopings are subjected to a curing and/or diffusion process (for example, rapid thermal annealing/furnace annealing processes).

In the advantageous embodiment shown in FIG. 2, a layer of polysilicon and a layer of dielectric are subsequently deposited on top of one another. The polysilicon layer is doped according to the zones to be connected and is structured together with the dielectric layer. This structuring occurs with a combination of photolithography and etching. When the base terminal zone is also to be contacted in addition to the emitter zone 7 and the collector zone 8, the part of the polysilicon layer applied on the base terminal zone must be doped for electrical conduction of the opposite operational sign. A contact layer 71 for the emitter zone 7 formed by the corresponding portion of this polysilicon layer is shown in FIG. 2. A contact layer 81 of the collector zone 8 formed by the corresponding portion of this polysilicon layer is also shown in FIG. 2. In addition, corresponding portions of a dielectric layer 72, 82 situated thereon are shown in FIG. 2.

Subsequently, a mask 10 of, for example, photoresist is produced (for example, by photolithography or electron beam exposure). In case the resist density is not adequate by itself to act as a blocking mask, an auxiliary layer can potentially be used that can be structured using the mask, for example with an etching step. The actual blocking layer is then either the layer that has just been set forth or a combination of this layer with the resist which has not been removed. This mask 10 is used in order to perform an implanting of dopant for the conductivity type opposite that of the basic doping. When, as in the exemplary embodiment, the basic doping has the same operational sign as emitter and collector, the implanting of the base zone 9 (see FIG. 3) is performed in the following step. The contact layers 71, 81 and, potentially, appertaining dielectric layers 72, 82 can also be applied and structured following the production of the base zone 9.

The mask 10 is removed, and the doping is cured. The structure of FIG. 3 results. A further emitter zone 74 having the operational sign of the conductivity of the emitter zone 7 is also situated between the emitter zone 7 and the base zone 9. A further collector zone 84 having the operational sign of the conductivity of the collector zone 8 is located between the base zone 9 and the collector zone 8. In an embodiment, it is possible to align the opening of the mask 10 such that the further emitter zone 74 is eliminated, and the emitter zone 7 directly adjoins the base zone 9 that is produced. For the sake of uniformity in the designation of the npn or pnp layers, the zone sequence in the direction shown in these cross sections is referred to as emitter zone, base zone and collector zone. By contrast to the base zone 9, however, the emitter zone 7 and the collector zone 8 are highly doped, whereas the highly doped terminal zone of the base zone 9 is arranged outside the plane of the section laterally adjoining thereat.

Figure 3:
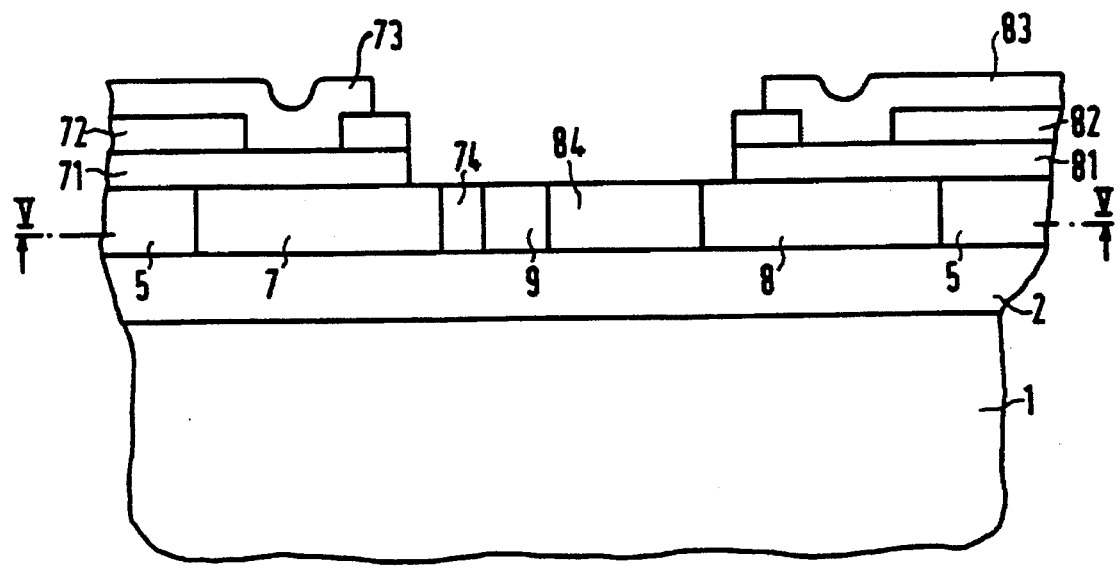
Figure 5:
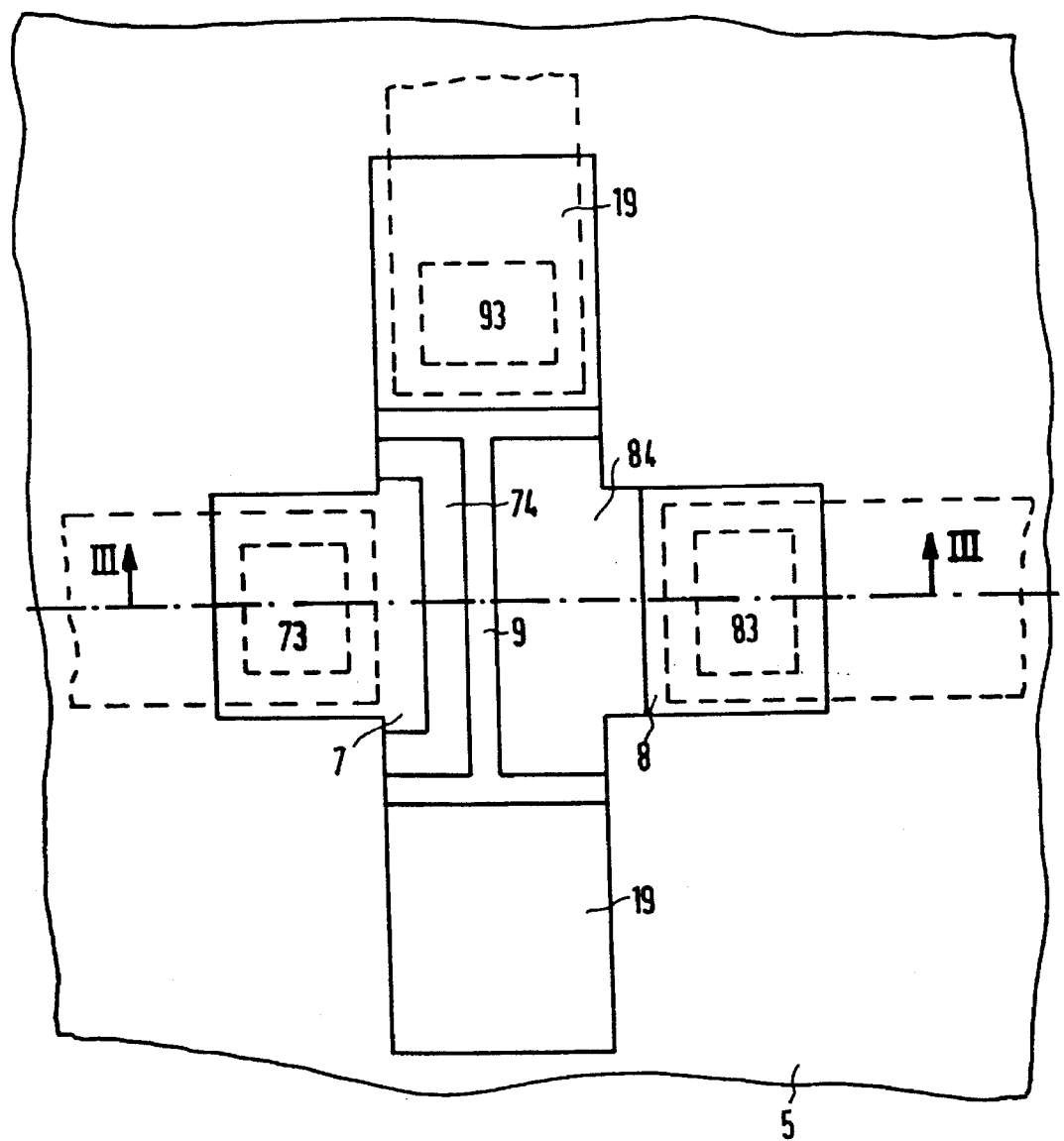
FIG. 5 illustrates the section shown in FIG. 3 of the present invention.

The relative alignment of these various zones with respect to one another is illustrated with reference to FIG. 5. FIG. 5 shows the section that is indicated in FIG. 3. In addition to the zones at the level of the original silicon layer 3, the contours of metallizations to be applied later are also shown with broken lines. The region of the transistor is annularly surrounded by the insulation region 5. The base zone 9 is oriented between the emitter zone 7 and the collector zone 8. A potentially present, further emitter zone 74 and further collector zone 84 having lower dopings in comparison to the emitter zone 7 and the collector zone 8, respectively, are likewise shown. A respective base terminal zone 19 that is highly doped is then located adjoining the base zone 9 perpendicular to the connecting direction between emitter zone 7 and collector zone 8. Metal contacts 73, 83, 93 for emitter, collector or, respectively, base are entered with broken-line contours.

A further dielectric (for example, $SiO_2$ or $Si_3N_4$) is then potentially deposited or grown and is structured such that by using a phototechnique, the emitter, collector and base zones can be contacted. The via holes for emitter, base and collector are produced and the corresponding metallizations are applied. For example, TiN/Al (Si, Cu) can be used. The structure of FIG. 3 thus results, however the connecting layers for the base terminal zone present in the viewing direction are not shown.

In the method of the invention, the polysilicon layer for contacting emitter and collector (contact layers 71, 81) can also be replaced by W/TiN or by other refractory metals, metal compounds or polycides (compounds of metal with polysilicon). In this case, the first metallization level can be completely implemented with these materials, so that two photolithography steps (via hole and first metallization level) are eliminated.

In the method of the invention, the emitter zone, the collector zone and the base terminal zone can also be directly contacted to the first metallization level after the manufacture of these zones. After the fabrication of the diffusion regions (for example, by implantation and subsequent curing), a dielectric is deposited surface-wide, and via holes are etched in this dielectric. The metallization is then introduced into these via holes.

An important advantage of this manufacturing method of the invention is the possibility, as shown in FIG. 3, of placing the base zone asymmetrically between emitter and collector and, thus, of being able to suitably set the breakdown voltage. A further advantage is the possibility of producing a further emitter zone 74 having the conductivity type of the highly doped emitter zone 7 in a simple way between the highly doped emitter zone 7 and the base zone 9. This occurs by suitably using the mask 10 (see FIG. 2. In this way, an overlap of the highly doped emitter zone 7 and base zone 9 is avoided. As a result thereof, the dimension and the height of the doping of this base zone 9 and, thus, of the bulk resistance of the base can be more exactly set without the breakdown behavior between emitter and base and the emitter-base capacitance and leakage currents being significantly deteriorated. The (absolute) amount of the doping height of this further emitter layer 74 is respectively less than that of the base zone 9 and of the highly doped emitter zone 7.

Figure 4:
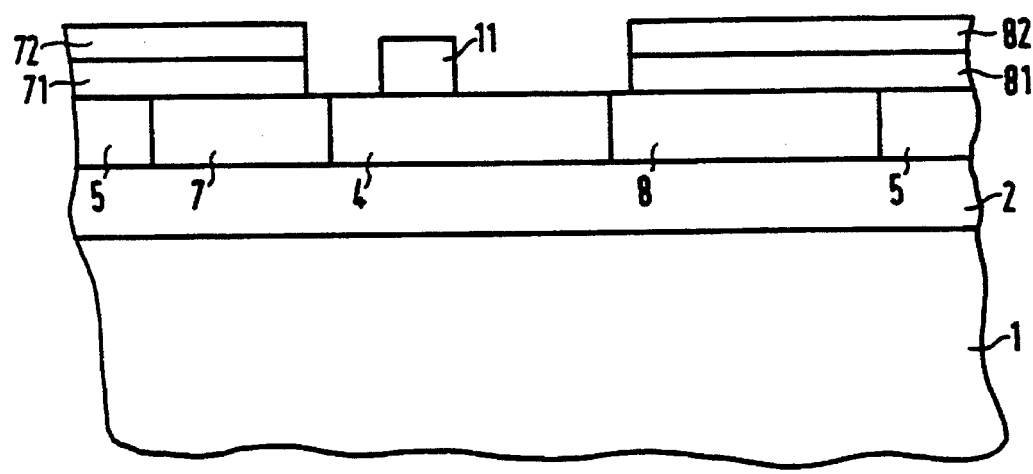
FIG. 4 illustrates an alternative embodiment of the method of the present invention in the process step of FIG. 2.

Instead of using the described basic doping, the method of the invention can also use a basic doping having the opposite conductivity type. The operational sign of this doping is then selected according to the operational sign of the base zone. As FIG. 4 shows, a lateral implantation for redoping the basic doping can be performed with a mask 11 which covers the base zone to be manufactured. This is in contrast to producing the base zone by implantation in a region of this basic doping through a gap in a mask. The ridge-shaped mask 11 is shown in cross section in FIG. 4 on the region 4 of the basic doping. The height of the basic doping is set according to the height of the base zone to be manufactured (for example, $1 \times 10^{18}$ cm$^{-3}$ through $4 \times 10^{18}$ cm$^{-3}$). The mask 11 is produced, for example, by photolithography. The dimension in the plane of FIG. 4, i.e. from the emitter zone 7 to the collector zone 8, is approximately 30–300 nm. The region 4 of the basic doping is converted into an oppositely doped region by implantation using the mask 11 (the doping height, for example, is $1 \times 10^{19}$ cm$^{-3}$–$2 \times 10^{20}$ cm$^{-3}$). The emitter zone, base zone and collector zone are thus produced self-aligned. The contacting thereby occurs in one of the alternative embodiments already set forth. The metallization can be directly applied onto the highly doped zones or a layer sequence having a lowest polysilicon layer that is correspondingly doped can be provided. In all manufacturing alternative embodiments, the base is extended perpendicular to the plane of the drawing and ends in a base terminal zone on which the appropriate contacting for the base terminal is applied. This connection can also occur directly by metal or indirectly via a polysilicon layer.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A method for manufacturing a lateral bipolar transistor, comprising the steps of:

laterally electrically insulating a region provided for said transistor in a silicon layer, said silicon layer being located on an insulating layer, said region having a basic doping;

producing a doped emitter zone, a doped base terminal zone and a doped collector zone by implantation of dopants in said silicon layer using masks, said doped zones being doped to a level to subsequently provide a ohmic metal-to-semiconductor contact;

producing a base zone by an implantation of dopant in said silicon layer for a conductivity type opposite that of said basic doping using a mask; and applying metal electrical contacts to said emitter zone, said base terminal zone and said collector zone for contacting an emitter, base and collector, respectively.

2. The method according to claim 1, wherein said step of laterally electrically insulating a region provided for a transistor in a silicon layer that is located on an insulating layer, said region having a basic doping is further defined by producing said basic doping for a conductivity type opposite the conductivity type of said base; and wherein said step of producing a base zone by an implantation of dopant in said silicon layer for a conductivity type opposite that of said basic doping using a mask is further defined by using said mask to cover the region provided for said base zone.

3. The method according to claim 1, wherein said step of laterally electrically insulating a region provided for a transistor in a silicon layer that is located on an insulating layer, said region having a basic doping is further defined by setting said basic doping for the conductivity type of said base; and wherein said step of producing a base zone by an implantation of dopant in said silicon layer for a conductivity type opposite that of said basic doping using a mask is further defined by using said mask to cover the region provided for said base zone.

4. The method according to claim 1, further comprising the step of:

applying contact layers of conductively doped polysilicon that are electrically insulated from one another on said emitter zone, said base terminal zone and said collector zone before said step of applying metal electrical contacts for said emitter, base and collector.

5. The method according to claim 4, wherein said step of applying said contact layers of conductively doped polysilicon that are electrically insulated from one another is performed before said step of producing a base zone by an implantation of dopant in said silicon layer for a conductivity type opposite that of said basic doping using a mask.

6. The method according to claim 1, wherein said step of producing a base zone by an implantation of dopant in said silicon layer for a conductivity type opposite that of said basic doping using a mask is further defined by providing said base zone oriented symmetrically with respect to said emitter zone and said collector zone so that a further emitter zone, doped to an essentially unmodified level of said basic doping, remains between said base zone and said emitter zone and so that a further collector zone, doped to an essentially unmodified level of said basic doping, having the conductivity of said basic doping remains between said base zone and said collector zone.

7. The method according to claim 1, wherein said step of producing a base zone by an implantation of dopant in said silicon layer for a conductivity type opposite that of said basic doping using a mask is further defined by producing said base zone such that it adjoins said emitter zone and so that a further collector zone, doped to an essentially unmodified level of said basic doping, having the conductivity type of the collector zone remains between said base zone and said collector zone.

* * * * *